United States Patent
Schwarzl et al.

(10) Patent No.: US 6,351,408 B1
(45) Date of Patent: Feb. 26, 2002

(54) MEMORY CELL CONFIGURATION

(75) Inventors: Siegfried Schwarzl; Lothar Risch, both of Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/544,761

(22) Filed: Apr. 6, 2000

Related U.S. Application Data

(63) Continuation of application No. PCT/DE98/02876, filed on Sep. 28, 1998.

(30) Foreign Application Priority Data

Oct. 6, 1997 (DE) .......................................... 197 44 095

(51) Int. Cl.⁷ ............................................. G11C 11/00
(52) U.S. Cl. ...................... 365/158; 365/171; 365/209; 365/207; 365/173; 365/145
(58) Field of Search ................................ 365/158, 171, 365/209, 207, 173, 145

(56) References Cited

U.S. PATENT DOCUMENTS

| | | | |
|---|---|---|---|
| 5,640,343 A | | 6/1997 | Gallagher et al. |
| 5,650,958 A | * | 7/1997 | Gallagher et al. ......... 365/173 |
| 5,793,697 A | * | 8/1998 | Scheuerlein ............... 365/171 |
| 5,872,739 A | * | 2/1999 | Womack ..................... 365/207 |

FOREIGN PATENT DOCUMENTS

| | | |
|---|---|---|
| DE | 1 960 972 | 5/1973 |
| DE | 197 26 852 A1 | 2/1998 |
| EP | 0 613 148 A2 | 8/1994 |
| EP | 0 780 912 A1 | 6/1997 |

OTHER PUBLICATIONS

"Technologiefrüherkennung, Techologieanalyse Magnetismus Band 2", Verein Deutscher Ingeneure (Mengel), dated Aug. 1997, pertains to the mentioned on p. 1 of the specification.

"Spin–Valve RAM Cell" (Tang et al.), dated Nov. 1995, IEEE Transactions on Magnetics, vol. 31, No. 6, pp. 3206–3208, as mentioned on p. 3 of the specification.

"An IC process compatible Nonvolatile Magnetic RAM" (Tang et al.), IEDM 95—997, pp. 5.7.1 to 5.7.3.

* cited by examiner

*Primary Examiner*—Richard Elms
*Assistant Examiner*—Vanthu Nguyen
(74) *Attorney, Agent, or Firm*—Herbert L. Lerner; Laurence A. Greenberg; Werner H. Stemer

(57) ABSTRACT

A memory cell configuration has word lines and bit lines running transversely with respect thereto. Memory elements with a magnetoresistive effect are respectively connected between one of the word lines and one of the bit lines. The memory elements are disposed in at least two layers one above the other.

9 Claims, 3 Drawing Sheets

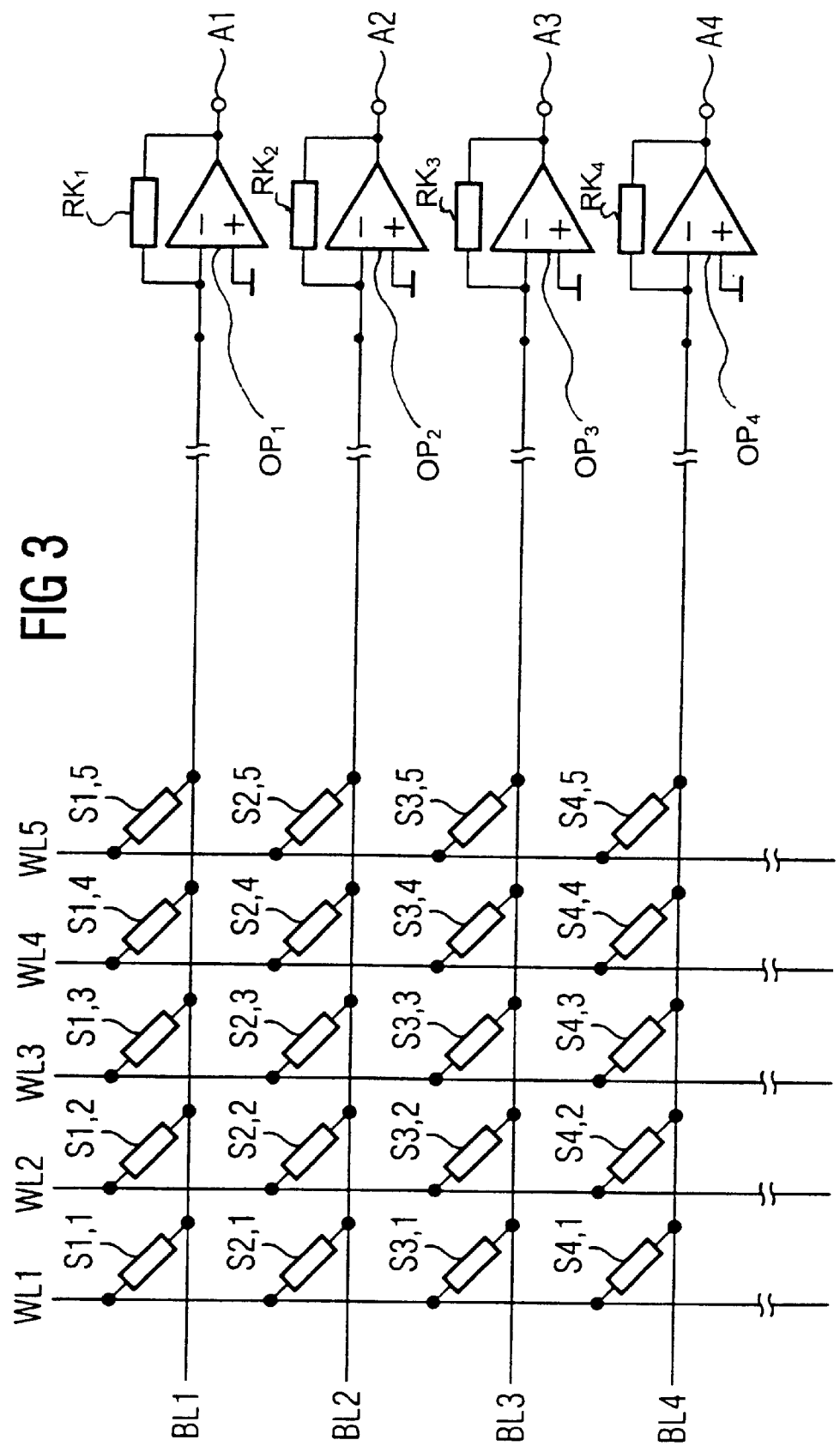

MEMORY CELL CONFIGURATION

CROSS-REFERENCE TO RELATED APPLICATION

This is a continuation of copending International Application PCT/DE98/02876, filed Sep. 28, 1998, which designated the United States.

BACKGROUND OF THE INVENTION

FIELD OF THE INVENTION

The invention relates to a memory cell configuration with memory elements having a layer structure with a giant magnetoresistive effect.

Layer structures with a magnetoresistive effect are known from the reference titled "Technology Analysis XMR-Technologien, Technologiefrüherkennung [XMR Technologies, Technology Detection at an Early Stage]", author Stefan Mengel, published by VDI-Technologiezentrum Physikalische Technologien. Depending on the construction of the layer structure, a distinction is made between a giant magnetoresistance (GMR) element, a tunneling magnetoresistance (TMR) element, an anisotropic magnetoresistance (AMR) element and a colossal magnetoresistance (CMR) element.

The term GMR element is used by experts for layer structures which have at least two ferromagnetic layers and a non-magnetic, conductive layer disposed in between and exhibit the so-called giant magnetoresistance effect, that is to say a large magnetoresistive effect in comparison with the AMR (anisotropic magnetoresistance) effect. The GMR effect encompasses the fact that the electrical resistance of the GMR element is dependent on whether the magnetizations in the two ferromagnetic layers are oriented in a parallel or an anti-parallel manner.

The term TMR element is used by experts for "tunneling magnetoresistance" layer structures which have at least two ferromagnetic layers and an insulating, non-magnetic layer disposed in between. In this case, the insulating layer is so thin that a tunneling current occurs between the two ferromagnetic layers. These layer structures likewise exhibit a magnetoresistive effect that is caused by a spin-polarized tunneling current through the insulating, non-magnetic layer disposed between the two ferromagnetic layers. In this case, too, the electrical resistance of the TMR element is dependent on whether the magnetizations in the two ferromagnetic layers are oriented in a parallel or antiparallel manner.

The AMR effect is manifested in the fact that the resistance in magnetized conductors is different parallel and perpendicular to the magnetization direction. It is a volume effect and thus occurs in single ferromagnetic layers.

A further magnetoresistance effect, which is called colossal magnetoresistance effect because of its magnitude ($\Delta R/R = 100$ percent . . . 400 percent at room temperature), requires a high magnetic field for changing over between the magnetization states on account of its high coercive forces.

It has been proposed (see, for example the reference by D. D. Tang et al, IEDM 95, pages 997 to 999, D. D. Tang et al, IEEE Trans. on Magnetics, Vol. 31, No. 6, 1995, pages 3206 to 3208, F. W. Patten et al, Int. Non Volatile Memory Technology Conf., 1996, pages 1 to 2) to use GMR elements as memory elements in a memory cell configuration. For this purpose, GMR elements in which the magnetization direction of one ferromagnetic layer is fixed for example by an adjacent antiferromagnetic layer are used as memory elements. The memory elements are connected in series via read lines. Word lines run transversely with respect to the latter and are insulated both from the read lines and from the memory elements. Signals applied to the word lines cause a magnetic field as a result of the current flowing in the word line, which magnetic field, given a sufficient strength, influences the memory elements situated underneath. In order to write information, signals are applied to a bit line and a word line, which are designated as X/Y lines and cross one another above the memory cell to be written to, which signals cause, at the crossover point, a magnetic field which is sufficient for the magnetization reversal. In order to read the information, a signal is applied to the word line, which signal switches the relevant memory cell back and forth between the two magnetization states. The current through the read line is measured and the resistance of the corresponding memory element is determined from the current.

The reference by S. Tehrani et al., IEDM 96, page 193 et seq., proposes using a GMR element having ferromagnetic layers of different thicknesses as the memory element. The magnetic field for writing information is dimensioned such that it only influences the magnetization in the thinner of the two ferromagnetic layers. The magnetization in the thicker of the two ferromagnetic layers remains uninfluenced by it.

SUMMARY OF THE INVENTION

It is accordingly an object of the invention to provide a memory cell configuration that overcomes the above-mentioned disadvantages of the prior art devices of this general type, which has memory elements with a magnetoresistive effect that can be fabricated with an increased packing density.

With the foregoing and other objects in view there is provided, in accordance with the invention, a memory cell configuration, including:

a plurality of word lines running substantially parallel to one another;

a plurality of bit lines running substantially parallel to one another and running transversely with respect to the word lines; and memory elements each having a layer structure with a magnetoresistive effect and disposed between one of the word lines and one of the bit lines, and the memory elements disposed in at least two layers disposed one above another.

The memory cell configuration has the word lines running essentially parallel to one another and the bit lines running essentially parallel to one another, with the word lines running transversely with respect to the bit lines. Memory elements having a layer structure with a magnetoresistive effect are provided, which memory elements are respectively disposed between one of the word lines and one of the bit lines.

In the literature, the term X-line or Y-line is also often used for the word and bit lines in connection with magnetic memories.

The memory elements are disposed in at least two layers. The layers are stacked one above the other. As a result, the area required by each memory element decreases and the packing density is increased. The larger the number of layers that are stacked one above the other, the-higher the packing density that can be attained. In this case, each layer of memory elements is disposed between two line planes, one line plane containing bit lines and the other line plane containing word lines. The bit lines and the word lines cross one another. A line plane that contains bit lines or word lines is respectively provided between adjacent layers.

The word lines and the bit lines, which cross one another, can each be fabricated with minimum dimensions and spacings of a minimum feature size F, resulting in an area requirement per memory element of $4F^2$ per layer. Overall, an area requirement of $4F^2/n$ per memory element results in the memory cell configuration given n layers.

The memory cell configuration is preferably realized using thin-film technology on a semiconductor substrate. Components for addressing the memory cell configuration are contained in the semiconductor substrate.

All known TMR elements and GMR elements in a current perpendicular to plane (CPP) configuration are suitable as the memory element. The GMR effect is greater if the current flows perpendicularly through the layer stack (CPP) than if the current flows in parallel in the layers (CIP current in plane). Furthermore, all XMR elements are suitable, the elements having two magnetization states with a different resistance, it being possible to switch back and forth between the states by the application of a magnetic field whose magnitude is acceptable for the memory application.

Preferably, the memory elements each have two ferromagnetic layers and a non-magnetic, insulating (TMR) or conductive (GMR) layer disposed in between. The memory elements each have two magnetization states. It is advantageous to use an insulating, non-magnetic layer (TMR element) because higher element resistances ($\geq 100$ k$\Omega$) can thereby be obtained, which are more favorable with regard to power consumption and signal/noise ratio.

One of the ferromagnetic layers is preferably disposed such that it is adjacent to an antiferromagnetic layer, which fixes the magnetization direction in the adjacent ferromagnetic layer. Materials containing at least one of the elements Fe, Mn, Ni, Ir, Tb and O are suitable, inter alia, for the antiferromagnetic layer.

As an alternative, the memory elements may each have two ferromagnetic layers and a non-magnetic layer disposed in between, one of the ferromagnetic layers being thicker than the other ferromagnetic layer or the ferromagnetic layers being formed from different materials with different magnetic properties, or have a non-magnetic, non-insulating layer. The effect achieved as a result of this is that only one ferromagnetic layer is subjected to magnetization reversal, while the other remains uninfluenced.

Materials containing at least one of the elements Fe, Ni, Co, Cr, Mn, Gd and Dy are suitable, inter alia, for the ferromagnetic layers. The thickness of the ferromagnetic layers is at most 20 nm and preferably lies in the range between 2 and 10 nm. $Al_2O_3$, NiO, $HfO_2$, $TiO_2$, NbO or $SiO_2$ is suitable as an insulating material for the non-magnetic layer, which acts as a tunneling insulator. Cu or Ag is suitable as a non-insulating material for the non-magnetic layer. The thickness of the non-magnetic layer lies in the range of between 1 and 4 nm, preferably between 2 and 3 nm.

The memory elements preferably have dimensions in the range of between 0.05 $\mu$m and 20 $\mu$m. They may be configured such that they are square or elongate, inter alia.

In order to write information to one of the memory elements, a respective signal is applied to the associated word line and to the associated bit line. As a result, a current flows via the word line and the bit line and induces a magnetic field in each case. At the crossover point of the word line and the bit line, the total magnetic field resulting from superposition of the two magnetic fields is large enough to ensure magnetization reversal of the memory element situated there. Outside the crossover point, the individual magnetic fields are too small for magnetization reversal of the memory elements situated there.

The information can be read in different ways. In order to read the information, a signal can be applied to the word line, which signal switches the relevant memory element back and forth from a first magnetization state to a second magnetization state. A current through the bit line connected to the memory element is then measured. If the magnetization state is switched over during this operation, then the current changes. A conclusion about the stored information is drawn from the occurrence or non-occurrence of a current change. If the magnetization state is altered during the read-out operation, then the original information must subsequently be written back.

Preferably, the bit lines are each connected to a sense amplifier by which a potential on the respective bit line can be regulated to a reference potential and at which an output signal can be picked off. The memory elements are respectively connected between the associated word line and bit line. In order to read the memory cell configuration, all the word lines that are not selected are put at the reference potential. A signal with a different potential is applied to the selected word line. A current path from the selected word line to all the bit lines is closed as a result of this. The resistance of the memory element situated at the crossover point between the word line and the respective bit line can be determined from the output signal at the respective sense amplifier, the electrical characteristic parameters of the sense amplifier, such as the feedback resistance, for example, and the reference potential and the bit line resistance. An alteration of the stored information does not occur, therefore, during the reading of the memory cell configuration.

The sense amplifier preferably has a feedback operational amplifier. The non-inverting input of the operational amplifier is connected to a reference potential, for example to ground. The bit line is connected to the inverting input. If the reference potential is 0 volts, then the operational amplifier ensures that 0 volts are present on the bit line. The output signal of the operational amplifier is a measure of the resistance of the selected memory element.

Other features which are considered as characteristic for the invention are set forth in the appended claims.

Although the invention is illustrated and described herein as embodied in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram of the architecture of the memory cell configuration.

DESCRIPTION OF THE PREFERRED EMBODIMENTS

Figure 1:
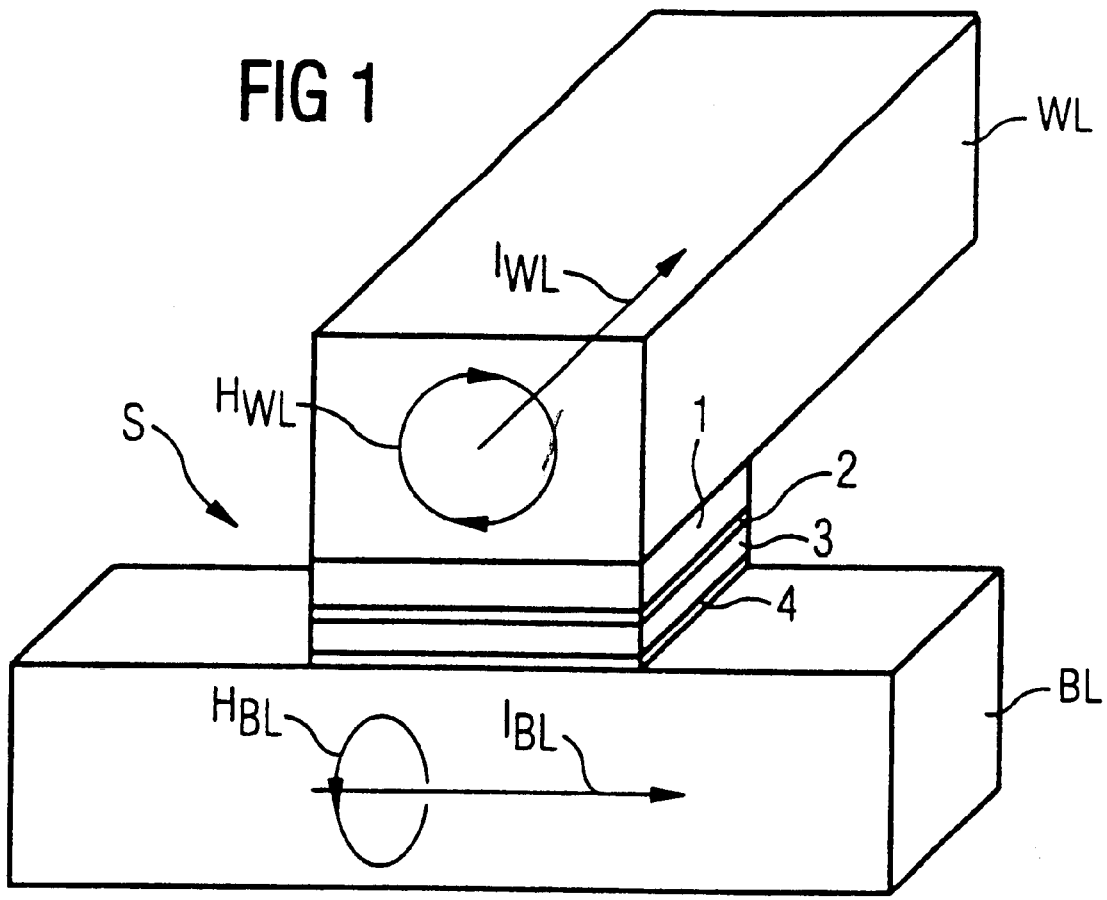
FIG. 1 is a perspective view of a memory element with an associated bit line and word line according to the invention.

In all the figures of the drawing, sub-features and integral parts that correspond to one another bear the same reference symbol in each case. Referring now to the figures of the drawing in detail and first, particularly, to FIG. 1 thereof, there is shown a memory element S that has a first ferromagnetic layer 1, a non-magnetic layer 2, a second ferromagnetic layer 3 and an antiferromagnetic layer 4. The first ferromagnetic layer 1, the non-magnetic layer 2 and the second ferromagnetic layer 3 constitute a layer structure. The first ferromagnetic layer 1 and the second ferromagnetic layer 3 contain NiFe and have a thickness of 10 nm. The non-magnetic layer 2 contains $Al_2O_3$ and has a thickness of 2 to 3 nm. The antiferromagnetic layer 4 contains FeMn and has a thickness of 10 to 20 nm. The first ferromagnetic layer 1 adjoins a word line WL. The antiferromagnetic layer 4 adjoins the bit line BL. The bit line BL runs below the word line WL. As an alternative, the bit line BL may also run above the word line WL. In the plane spanned by the bit lines BL and the word line WL, the memory element S has a cross section of 0.25 $\mu$m×0.25 $\mu$m, for example.

The bit lines BL and the word lines WL are each formed from Al with 0.5% by weight of Cu with a thickness which is dimensioned such that the current density in the bit lines BL and word lines WL does not exceed $10^6$ A/cm$^2$.

In order to write information to the memory element, a current $I_{WL}$ is impressed on the word line WL and a current $I_{BL}$ is impressed on the bit line BL. These currents induce a magnetic field $H_{WL}$ around the word line WL and a magnetic field $H_{BL}$ around the bit line BL. At the crossover point of bit line and word line, the resulting magnetic field is so large that it influences the magnetization of the first ferromagnetic layer 1. The magnetization of the second ferromagnetic layer 3 is fixed by the antiferromagnetic layer adjacent to it.

Figure 2:
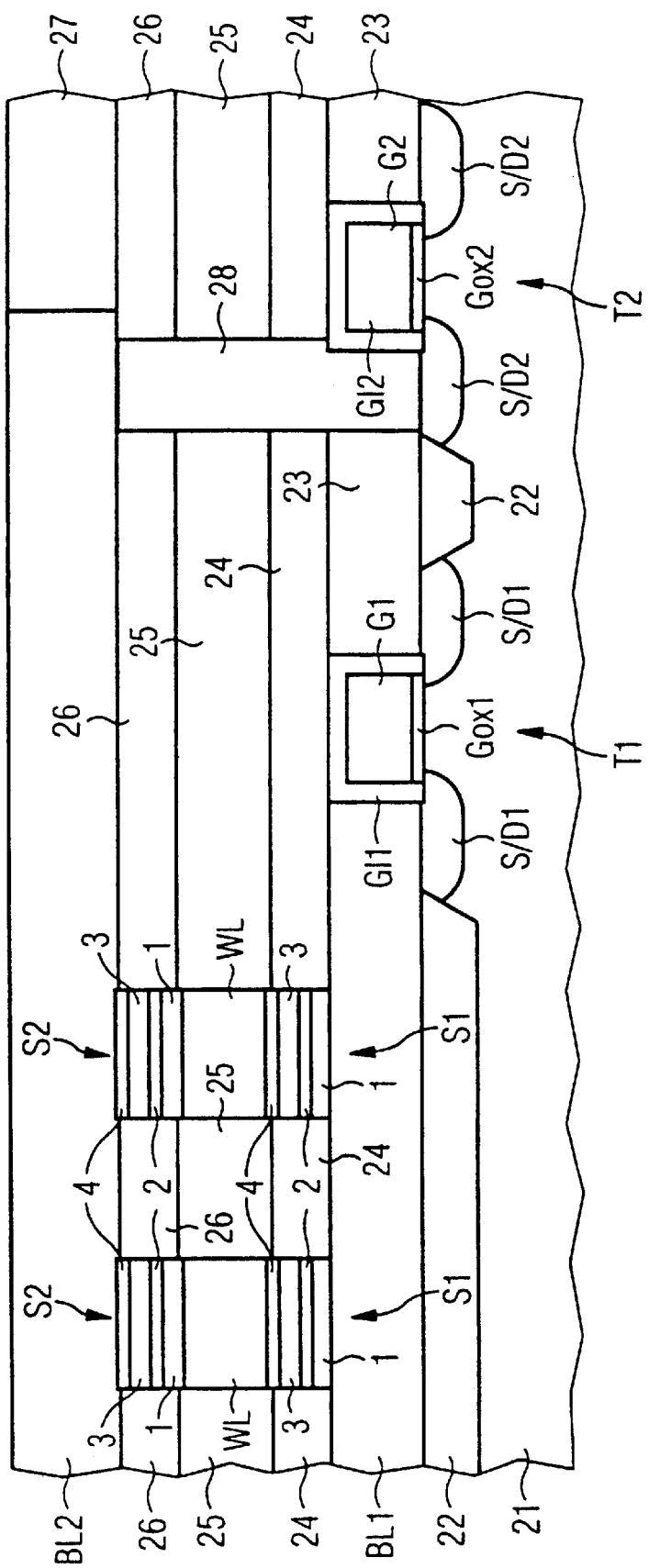
FIG. 2 is a sectional view through a memory cell configuration having a plurality of layers with memory elements.

A semiconductor substrate 21, for example a monocrystalline silicon wafer or a monocrystalline silicon layer, is disposed on a surface of an insulating layer of a silicon-on-insulator (SOI) substrate. The insulating layer being disposed on a support body, has an insulation structure 22 in the region of a surface (see FIG. 2). The insulation structure 22 contains $SiO_2$ and is formed for example by local oxidation in a LOCOS process or by the formation of shallow trenches, filled with insulating material, in a shallow trench isolation (STI) process.

The insulation structure 22 covers the substrate 21 in the region of a cell array and defines active zones in the region of a periphery.

In a region of the cell array, strip-type first bit lines BL1 running parallel to one another are disposed on the surface of the insulation structure 22. The bit lines BL1 have a thickness of 0.6 $\mu$m, a length of 50 $\mu$m, a width of 0.25 $\mu$m and a spacing between adjacent first bit lines BL of 0.25 $\mu$m. The bit lines BL1 are formed from AlCu or silicides, for example. Adjacent first bit lines BL1 are insulated from one another by a planarizing insulating layer 23 made of $SiO_2$ or $Si_3N_4$.

On a surface of the first bit lines BL1, memory elements S1 are disposed in grid form in a first layer. The memory elements S1 are constructed like the memory element S, which has been explained with reference to FIG. 1. They each have the first ferromagnetic layer 1, the non-magnetic layer 2, the second ferromagnetic layer 3 and the antiferromagnetic layer 4. The first ferromagnetic layer 1 and the second ferromagnetic layer 3 contain NiFe and have a thickness of 10 nm. The non-magnetic layer 2 contains $Al_2O3$ and has a thickness of 2 to 3 nm. The antiferromagnetic layer 4 contains FeMn and has a thickness of 10 to 20 nm. Parallel to the surface of the substrate 21, the memory elements Si each have a cross section of 0.25 $\mu$m×0.25 $\mu$m.

The memory elements S1 are insulated from one another by a planarizing insulating layer 24 made of $SiO_2$ or $Si_3N_4$.

Strip-type word lines running parallel to one another are disposed above the first layer of memory elements S1 and run perpendicularly to the first bit lines BL1. The memnory elements S1 of the first layer are each disposed at the crossover point between one of the word lines WL and one of the first bit lines BL1. The word lines WL have a thickness of 0.6 $\mu$m, for example. They contain AlCu and Ti/TiN. A width of the word lines WL is 0.25 $\mu$m, the spacing between adjacent word lines WL is 0.25 $\mu$m. A length of the word lines WL is 5000 $\mu$m. A planarizing insulation layer 25 made of $SiO_2$ is disposed between adjacent word lines WL.

A second layer of memory elements S2 is disposed above the word lines WL. The memory elements S2 are disposed in grid form like the memory elements S1 of the first layer. They are each in contact with one of the word lines WL. The memory elements S2 are constructed like the memory elements S1 and have the first ferromagnetic layer 1, the non-magnetic layer 2, the second ferromagnetic layer 3 and the antiferromagnetic layer 4. With regard to a thicknesses and materials of the memory elements S2, what was stated in connection with the memory elements S1 is applicable.

Adjacent memory elements S2 of the second layer are insulated from one another by a planarizing insulating layer 26. It is formed from $SiO_2$ or $Si_3N_4$, for example, by deposition and chemical mechanical polishing.

Second bit lines BL2 are disposed above the second layer of memory elements S2. The second bit lines BL2 are in the form of strips and run parallel to one another. Furthermore, they run parallel to the first bit lines BL1. The second bit lines BL2 contain AlCu and Ti/TiN and have a thickness of 0.6 $\mu$m and a length of 50 $\mu$m. They have a width of 0.25 $\mu$m and a spacing between adjacent second bit lines BL2 of 0.25 $\mu$m. Adjacent second bit lines BL2 are insulated from one another by a planarizing insulating layer 27, for example made Of $SiO_2$.

In the periphery, first transistors T1 and second transistors T2 are disposed in the substrate 21, by use of which transistors in each case one of the first bit lines BL1 and, respectively, one of the second bit lines BL2 can be driven. The first transistor T1 has source/drain regions S/D1, a gate oxide GOX1, a gate electrode G1 and a gate insulation GI1. The second transistor T2 has source/drain regions S/D2, a gate oxide GOX2, a gate electrode G2 and a gate insulation GI2.

The first bit lines BL1 are each connected to one of the source/drain regions S/D1 of the respective first transistor Tl. This is effected for example by the first bit line BL1 reaching as far as the surface of the relevant source/drain region S/D1. The second bit line BL2 is connected to the associated second transistor T2 via a contact 28. The contact 28 is realized for example by opening a deep contact hole which traverses the planarizing insulating layers 23, 24, 25, 26 and is filled with a metallic filling. As an alternative, the contact hole may be opened and filled in a multistage process in particular at the same time as the patterning of the first bit lines BL1, of the first layer of memory elements S1, of the word lines WL, of the second layer of memory elements S2 and of the second bit lines BL2. The contact 28 reaches the surface of one of the source/drain regions S/D2 of the second transistor T2.

The area requirement per memory cell is 4 (0.25 $\mu$m)$^2$/2 in this example.

The memory cell configuration has bit lines BLi, i=1, 2, . . . n running essentially parallel to one another. Word lines WLj, j=1, 2, ... m run transversely with respect to the bit lines. The word lines WLj likewise run essentially parallel to one another. A memory element Si,j is disposed at each of the crossover points between the bit lines BLi and the word lines WLj in each layer (see FIG. 3).

The bit lines BLi are each connected to an inverting input of an operational amplifier OPi, i=1, 2 ... n. A non-inverting input of the operational amplifier OPi is connected to ground potential. The operational amplifiers OPi have feedback and each have a feedback resistor RKi. The operational amplifiers OPi each have an output Ai.

In the memory cell configuration, one of the resistances of the memory elements Si,j is respectively assigned to the logic values zero and one.

In order to read out the information stored in the memory cell configuration, the word line WLj is driven in order to read out the information stored in the memory element Si,j. For this purpose, the word line WLj is put at a potential of +1 volt, for example. All the other word lines WLl, l≠j, are put at 0 volts. All the bit lines BLi, i=1 ... n are likewise at 0 volts since they are connected to the inverting input of the feedback operational amplifier OPi, which constantly regulates itself to 0 volts. A voltage $$U_{out} = 1V * \frac{R}{(Rx + Rl)}$$

is picked off at the output Ai of the operational amplifier OPi, where R is the resistance of the feedback resistor RKi, Rx is the resistance of the memory element Si,j and Rl is the resistance of the line portions of the word line WLj and of the bit line BLi via which the current flows. The resistance Rx of the memory element Si,j can be calculated from the voltage, since the remaining parameters are known.

The bit lines BLi and the word lines WLj are formed from metal, with the result that their resistance is very small. The feedback resistor RKi has a resistance of 100 kΩ, for example. The resistance Rx of the memory element Si,j is approximately 100 kΩ if the magnetization of the first ferromagnetic layer 1 and of the second ferromagnetic layer 3 is oriented in a parallel manner, and 110 kΩ if the magnetization of the first ferromagnetic layer 1 and of the second ferromagnetic layer 3 is oriented in an antiparallel manner. For each layer, 100 bit lines BLi and 10,000 word lines BLj are provided. The change in the input signal is thus 100 mV, depending on the assumed resistance of the memory element Si,j. With a resistance ratio $$\frac{R}{(Rx + Rl)}$$

of 10, the change can be amplified to 1 volt at the output Ai of the operational amplifier OPi.

Since all the bit lines BLi are at 0 volts, no parasitic currents flow between the bit lines BLi. The current path is closed only between the selected word line WLj and all the bit lines. It is advantageous, therefore, to use a larger number of word lines WLj than bit lines BLi. A memory cell configuration with 1 Mbit per layer of memory elements is preferably constructed with n=100 bit lines BLi and M=10,000 word lines WLj. As a result, only 100 sense amplifiers are necessary for each layer. The current which respectively flows into the selected word lines BLj results from the connection in parallel of 100 memory elements Si,j, which each have a resistance of approximately 100 kΩ. This parallel circuit has a resistance of approximately 1 kΩ. The length of the bit lines BLi is unimportant here since the latter is not subjected to charge reversal. In order to write information to the memory cell Si,j, a current $I_{WL}$, $I_{BL}$ of the mA order of magnitude is respectively impressed on the bit line BLi and the word line WLj. The current induces a magnetic field $H_{WL}$, $H_{BL}$ in each case around the write line BLi and the word line WLj, which magnetic field influences the magnetization of the first ferromagnetic layer 1 at the crossover point between the bit line BLi and the word line WLj (see FIG. 1). The magnetization of the second ferromagnetic layer 3 is fixed by the antiferromagnetic layer 4 adjacent to it.

We claim:

1. A memory cell configuration, comprising:
   a plurality of word lines running substantially parallel to one another;
   a plurality of bit lines running substantially parallel to one another and running transversely with respect to said word lines; and
   memory elements each having a layer structure with a magnetoresistive effect and disposed between one of said word lines and one of said bit lines, and said memory elements disposed in at least two layers disposed one above another.

2. The memory cell configuration according to claim 1, wherein:
   said layer structure of said memory elements includes two ferromagnetic layers and a non-magnetic layer disposed in between said two ferromagnetic layers; and
   said memory elements each have two magnetization states.

3. The memory cell configuration according to claim 2, wherein:
   said two ferromagnetic layers each contain at least one element selected from the group consisting of Fe, Ni, Co, Cr, Mn, Gd, and Dy;
   said two ferromagnetic layers each have a thickness of less than or equal to 20 nm; and said non-magnetic layer contains at least one material selected from the group consisting of $Al_2O_3$, NiO, $HfO_2$, $TiO_2$, NbO, and $SiO_2$, and has a thickness in a range of between 1 and 4 nm.

4. The memory cell configuration according to claim 2, wherein said layer structure includes an antiferromagnetic layer disposed adjacent to one of said two ferromagnetic layers and said anitferromagnetic layer determines a magnetization direction in an adjacent ferromagnetic layer.

5. The memory cell configuration according to claim 4, wherein said antiferromagnetic layer contains at least one element selected from the group consisting of Fe, Mn, Ni, Ir, Tb and O.

6. The memory cell configuration according to claim 1, wherein said memory elements, in a plane spanned by said word lines and said bit lines, have dimensions in a range of between 0.5 μm and 20 μm.

7. The memory cell configuration according to claim 1, wherein said memory elements each have a higher resistance than said bit lines and said word lines, and including sense amplifiers connected to said bit lines and provided for regulating a potential of said bit lines to a reference potential and at which an output signal can be picked off.

8. The memory cell configuration according to claim 7, wherein said sense amplifiers each have a feedback operational amplifier.

9. The memory cell configuration according to claim 7, wherein a number of said word lines is greater than a number of said bit lines in dependence on a layer of said memory elements.

* * * * *